(12) United States Patent
Shafran et al.

(10) Patent No.: US 9,773,201 B2
(45) Date of Patent: Sep. 26, 2017

(54) ELECTRONIC INTERFACE APPARATUS AND METHOD AND SYSTEM FOR MANUFACTURING SAME

(71) Applicant: Smartrac IP B.V., Amsterdam (NL)

(72) Inventors: Guy Shafran, Rosh-Pina (IL); Oded Bashan, Rosh-Pina (IL)

(73) Assignee: SMARTRAC IP B.V., Amsterdam (NL)

( * ) Notice: Subject to any disclaimer, the term of this patent is extended or adjusted under 35 U.S.C. 154(b) by 0 days.

(21) Appl. No.: 14/694,430

(22) Filed: Apr. 23, 2015

(65) Prior Publication Data
US 2015/0227830 A1    Aug. 13, 2015

Related U.S. Application Data

(63) Continuation of application No. 12/596,893, filed as application No. PCT/IL2007/001378 on Nov. 8, 2007, now Pat. No. 9,038,913.

(30) Foreign Application Priority Data

Apr. 24, 2007 (CN) .................................. 07104374

(51) Int. Cl.
G06K 19/00        (2006.01)
G06K 19/077       (2006.01)

(52) U.S. Cl.
CPC ... G06K 19/07754 (2013.01); G06K 19/0775 (2013.01); G06K 19/07745 (2013.01);
(Continued)

(58) Field of Classification Search
CPC . H01L 2224/48091; H01L 2224/48227; H01L 2224/48092; H01L 2224/48095;
(Continued)

(56) References Cited

U.S. PATENT DOCUMENTS 5,023,751 A     6/1991  Stampfli
5,519,201 A  *  5/1996  Templeton, Jr. . G06K 19/07745
                                                     235/492
(Continued)

FOREIGN PATENT DOCUMENTS

CN    1622126 A    6/2005
CN    1764932 A    4/2006
(Continued)

OTHER PUBLICATIONS

Extended European Search Report and Written Opinion for Application No. EP07827351.3 dated Aug. 5, 2010.
(Continued)

*Primary Examiner* — Christopher Stanford
(74) *Attorney, Agent, or Firm* — Locke Lord LLP

(57) ABSTRACT

A method for manufacture of an electronic interface card including defining a pair of apertures in a substrate layer, associating an antenna with the substrate layer such that opposite ends of the antenna terminate at the apertures, placing a metal element in each of the apertures, connecting the ends of the antenna to the metal elements, laminating the substrate layer together with a top layer and a bottom layer, forming a recess in the top layer and the substrate layer, attaching ends of connection wires to the metal elements, attaching opposite ends of the connection wires to a chip module and sealing the chip module in the recess.

5 Claims, 9 Drawing Sheets

(52) U.S. Cl.
CPC . *G06K 19/07749* (2013.01); *G06K 19/07773* (2013.01); *H01L 2924/0002* (2013.01); *Y10T 29/49002* (2015.01); *Y10T 29/4913* (2015.01); *Y10T 29/49016* (2015.01); *Y10T 29/49018* (2015.01); *Y10T 29/49117* (2015.01); *Y10T 29/49169* (2015.01); *Y10T 29/5317* (2015.01); *Y10T 29/53178* (2015.01)

(58) Field of Classification Search
CPC ......... G06K 19/07749; G06K 19/0775; G06K 19/07745; G06K 19/07783; G06K 19/07747; G06K 19/077; H05K 1/183
See application file for complete search history.

(56) References Cited

U.S. PATENT DOCUMENTS

| | | | |
|---|---|---|---|
| 5,786,626 A * | 7/1998 | Brady | G06K 19/07749 257/666 |
| 5,809,633 A | 9/1998 | Mundigl et al. | |
| 5,972,156 A | 10/1999 | Brady et al. | |
| 6,095,424 A | 8/2000 | Prancz | |
| 6,336,269 B1 | 1/2002 | Eldridge et al. | |
| 6,378,774 B1 | 4/2002 | Emori et al. | |
| 6,481,621 B1 | 11/2002 | Herrendoerfer et al. | |
| 6,568,600 B1 | 5/2003 | Carpier et al. | |
| 6,607,135 B1 | 8/2003 | Hirai et al. | |
| 6,881,605 B2 | 4/2005 | Lee et al. | |
| 7,204,427 B2 | 4/2007 | Patrice | |
| 7,240,847 B2 | 7/2007 | Puschner et al. | |
| 7,243,840 B2 | 7/2007 | Bason et al. | |
| 7,269,021 B2 | 9/2007 | Gundlach et al. | |
| 7,271,039 B2 | 9/2007 | Halope | |
| 7,278,580 B2 | 10/2007 | Jones et al. | |
| 2004/0188531 A1 | 9/2004 | Gengel et al. | |
| 2004/0206799 A1 | 10/2004 | Wong | |
| 2004/0245347 A1 | 12/2004 | Shibamoto et al. | |
| 2006/0181478 A1 | 8/2006 | Benato | |

FOREIGN PATENT DOCUMENTS

| | | |
|---|---|---|
| TW | 421760 B | 2/2001 |
| TW | 513672 B | 12/2002 |
| TW | 565894 B | 12/2003 |
| TW | 565916 B | 12/2003 |
| TW | 200419845 A | 10/2004 |
| TW | 200710739 | 3/2007 |
| WO | WO-9705570 A1 | 2/1997 |
| WO | WO-9734247 A2 | 9/1997 |

OTHER PUBLICATIONS

English translation of Chinese Office Action date Jun. 8, 2011 issued on corresponding Chinese Patent Application No. 200780053470.2.
Taiwanese Search Report with English Translation dated Jun. 21, 2013.
Office Action and Search Report of ROC (Taiwan) Patent Application No. 96142616 dated Dec. 2013.
Office Action for Korean Patent Application No. 10-2009-7024350 dated Jan. 4, 2013.
International Search Report for PCT/IL07/01378 dated Sep. 2, 2008.
Written Opinion of the International Searching authroity for PCT/IL07/01378 dated Sep. 2, 2008.

* cited by examiner

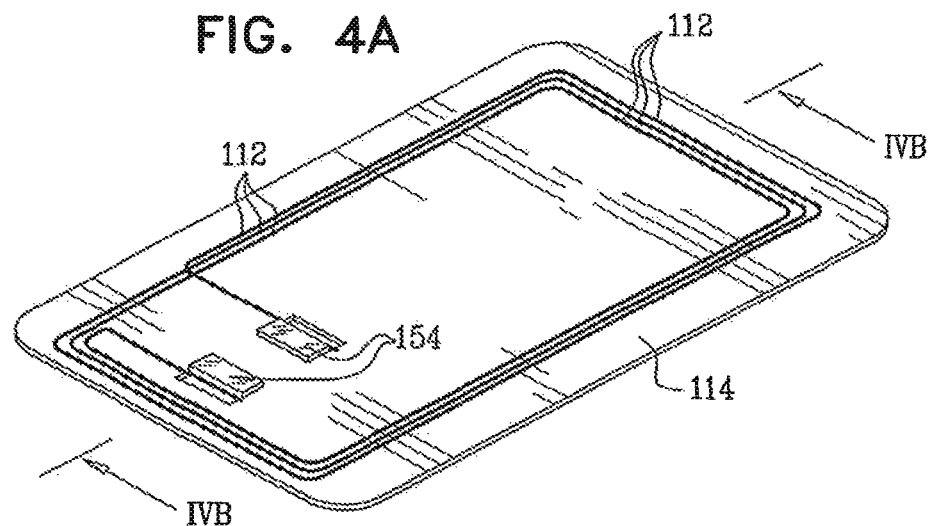
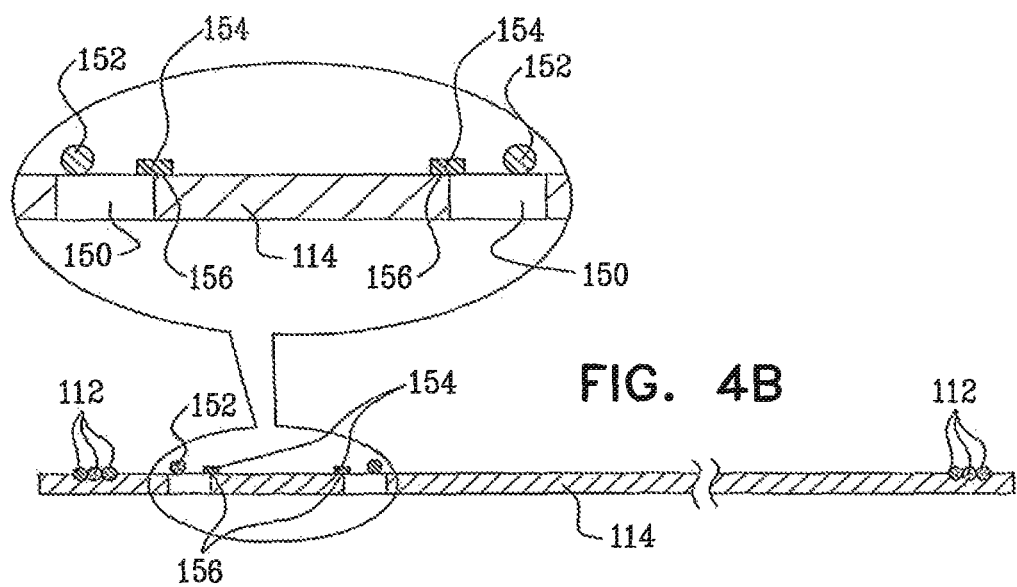

FIG. 5A
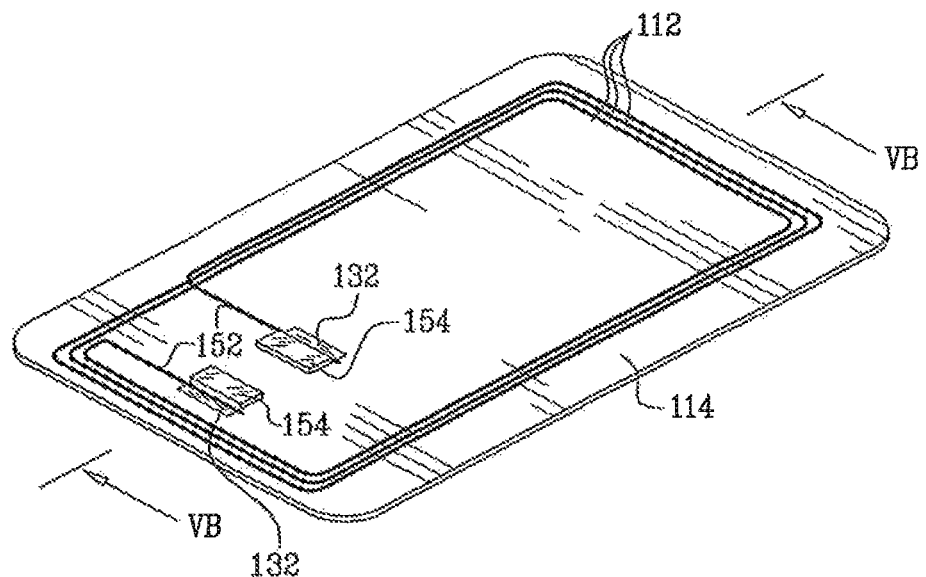
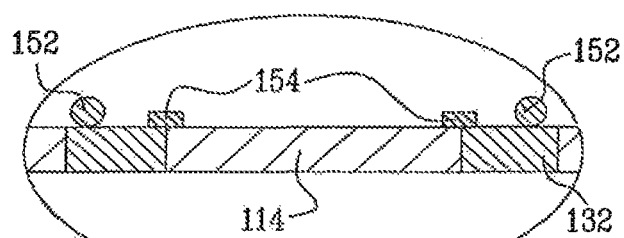
FIG. 5B
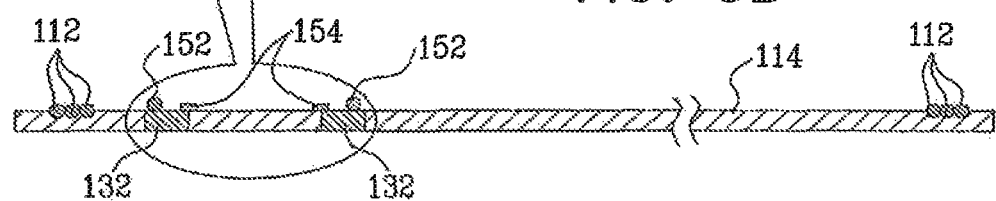

FIG. 7A
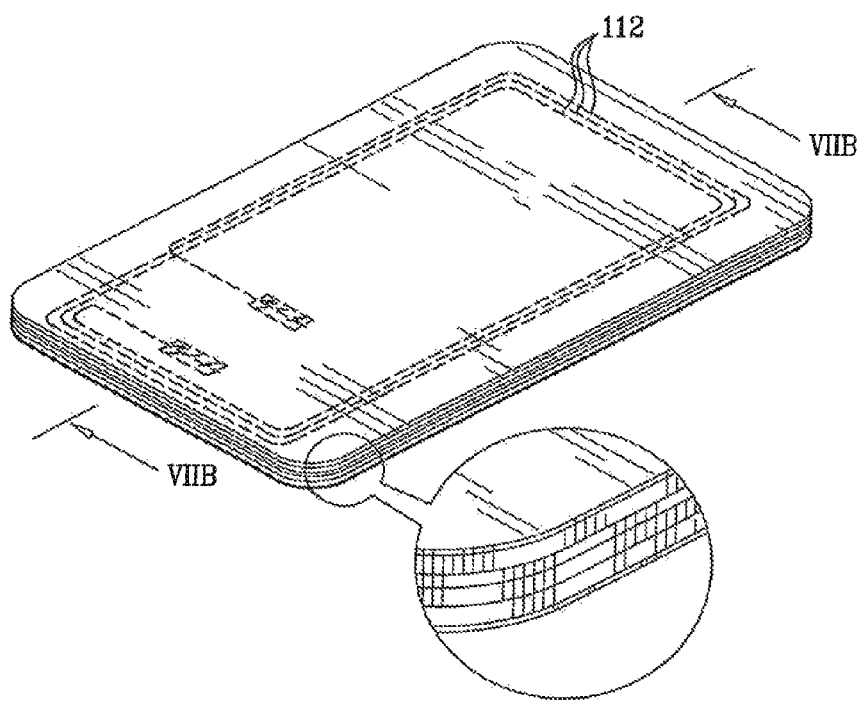
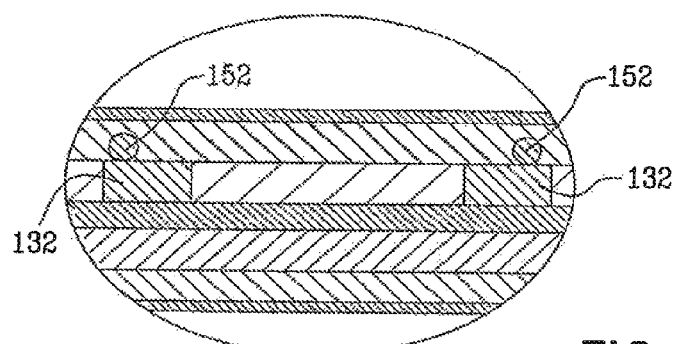
FIG. 7B
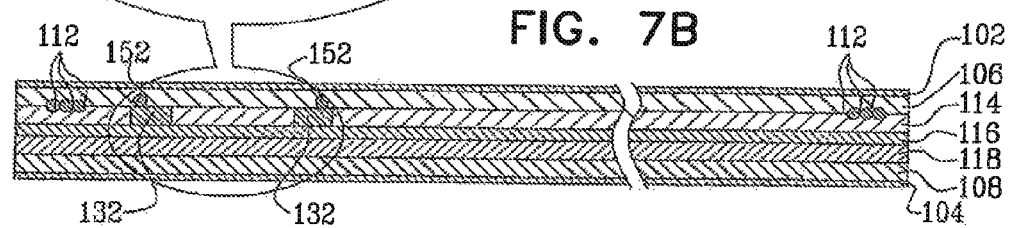

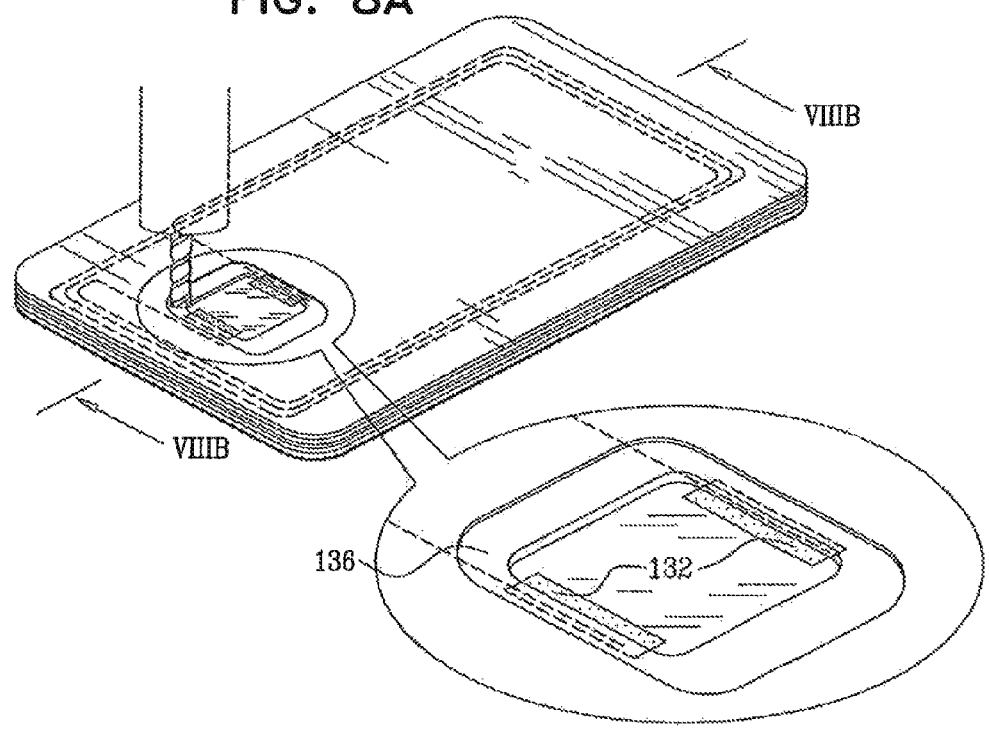
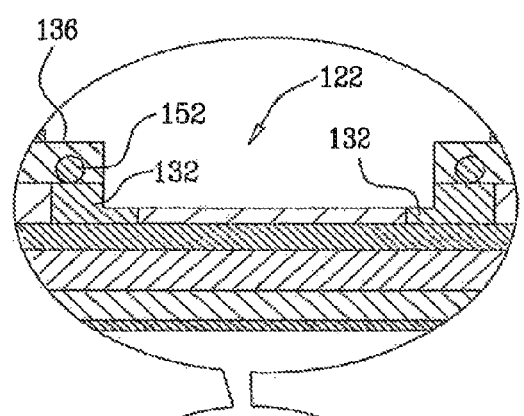
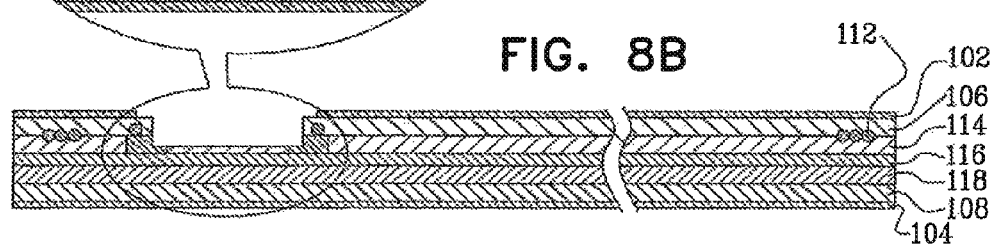
FIG. 8A
FIG. 8B

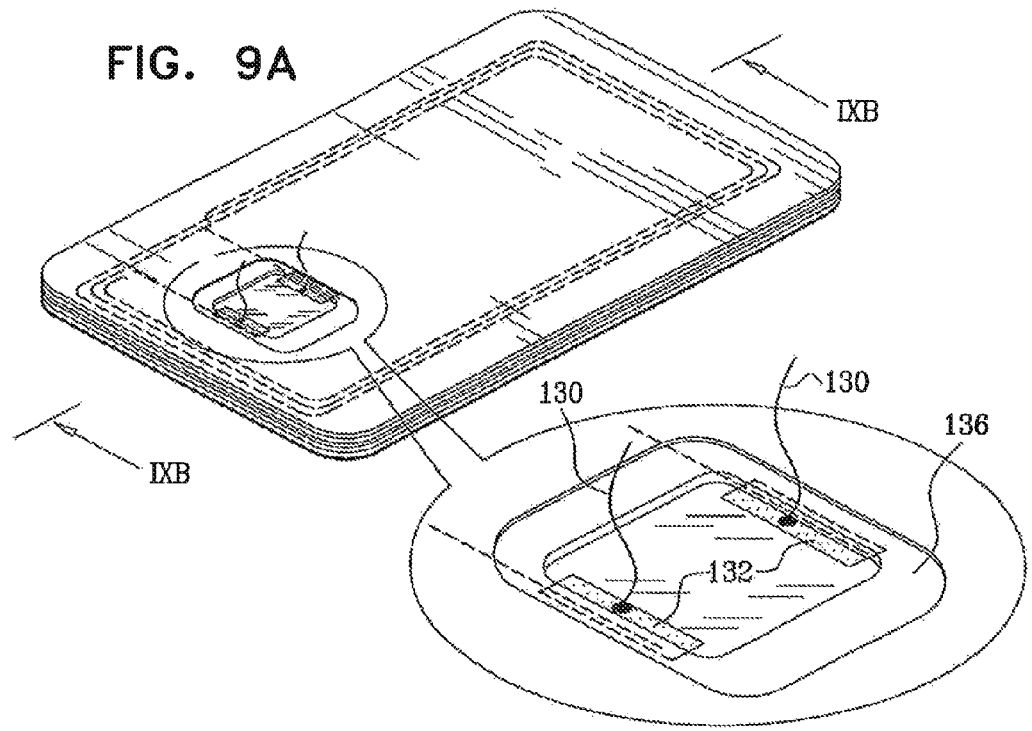
FIG. 9A
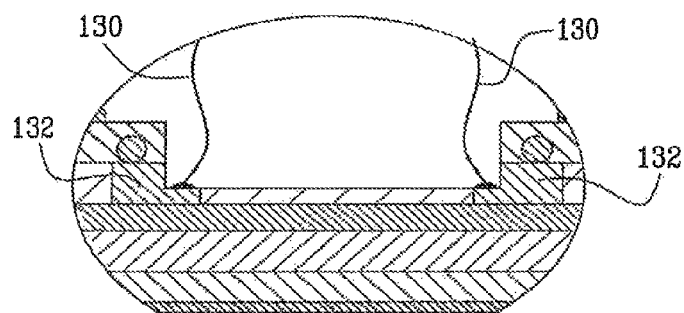
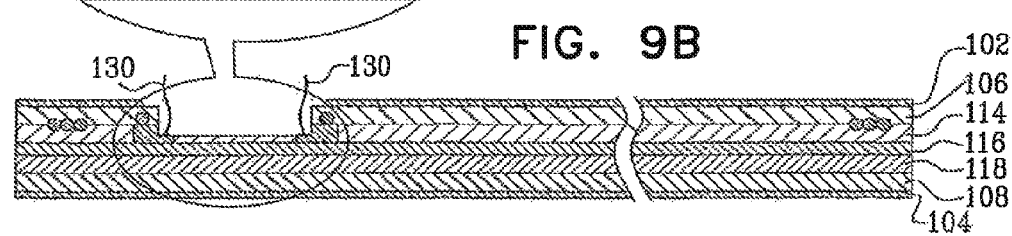
FIG. 9B

ELECTRONIC INTERFACE APPARATUS AND METHOD AND SYSTEM FOR MANUFACTURING SAME

CROSS-REFERENCE TO RELATED APPLICATIONS

This application is a continuation of U.S. patent application Ser. No. 12/596,893, filed Apr. 28, 2010, which is a National Stage Entry of PCT/IL07/01378, filed Nov. 8, 2007, which claims priority to Chinese Application No. 07104374.1, filed Apr. 24, 2007. Each of the above-referenced applications is incorporated by reference herein in its entirety.

FIELD OF THE INVENTION

The present invention relates to electronic interface cards, also known as "smart cards" generally and more particularly to electronic interface cards having contact and/or contactless functionalities.

BACKGROUND OF THE INVENTION

The following U.S. Patents are believed to represent the current state of the art:

U.S. Pat. Nos. 7,278,580; 7,271,039; 7,269,021; 7,243,840; 7,240,847 and 7,204,427.

SUMMARY OF THE INVENTION

The present invention seeks to provide improved electronic interface cards and methods for manufacturing thereof.

There is thus provided in accordance with a preferred embodiment of the present invention, a method for manufacture of an electronic interface card including defining a pair of apertures in a substrate layer, associating an antenna with the substrate layer such that opposite ends of the antenna terminate at the apertures, placing a metal element in each of the apertures, connecting the ends of the antenna to the metal elements, laminating the substrate layer together with a top layer and a bottom layer, forming a recess in the top layer and the substrate layer, attaching ends of connection wires to the metal elements, attaching opposite ends of the connection wires to a chip module and sealing the chip module in the recess.

Preferably, the method also includes providing a first additional substrate layer and a second additional substrate layer onto the underside of the substrate layer prior to the laminating. Additionally or alternatively, the top layer includes a first top substrate layer and a second top substrate layer. Additionally, the method also includes exposing a recessed surface of the second top layer adjacent the recess and the sealing includes placing an adhesive on an underside of the chip module and inserting the chip module into the recess such that the underside engages the recessed surface.

Preferably, the method also includes folding the wires underneath the chip module. Additionally or alternatively, the method is automated.

Preferably, the attaching ends of connection wires to the metal elements includes laser bonding. Additionally or alternatively, the attaching opposite ends of the connection wires to a chip module includes soldering.

Preferably, the wires have a length substantially greater than the distance between their respective opposite ends in the electronic interface card.

There is also provided in accordance with another preferred embodiment of the present invention a method for manufacture of an electronic interface card including forming a substrate having at least one layer, forming an antenna in the at least one layer, forming a recess in the at least one layer, connecting wires between a chip module and the antenna and mounting the chip module in the recess.

Preferably, the wires have a length substantially greater than the distance between their respective opposite ends in the electronic interface card. Additionally or alternatively, the connecting wires includes connecting the antenna to metal elements and connecting the wires to the metal elements. Additionally or alternatively, the mounting including folding the wires underneath the chip module.

Preferably, the method is automated.

There is further provided in accordance with yet another preferred embodiment of the present invention an electronic interface card including a substrate, a wire antenna associated with the substrate, a chip module mounted in a recess formed in the substrate and wires providing electrical connections between the chip module and the wire antenna.

Preferably, the chip module includes a packaged smart card chip. Additionally or alternatively, the wires are folded underneath the chip module in the recess. Additionally or alternatively, the wires have a length substantially greater than the distance between their respective opposite ends in the electronic interface card.

There is still further provided in accordance with still another preferred embodiment of the present invention a system for manufacturing an electronic interface card based on an electronic interface assembly including a substrate having at least one layer, at least two metal elements located in the at least one layer and a wire antenna associated with the substrate and having ends electrically coupled to the at least two metal elements, the system including a laminator operative to laminate the substrate layer together with a top layer and a bottom layer, a recess former operative to form a recess in the top layer and the substrate layer, a first wire attacher operative to attach ends of connection wires to the metal elements, a second wire attacher operative to attach opposite ends of the connection wires to a chip module and a sealer operative to seal the chip module in the recess.

Preferably, the first wire attacher is a laser bonding wire attacher. Additionally or alternatively, the second wire attacher is a soldering wire attacher.

There is even further provided in accordance with another preferred embodiment of the present invention an electronic interface assembly including a substrate having at least one layer, at least two metal elements located in the at least one layer and a wire antenna associated with the substrate and having ends electrically coupled to the at least two metal elements.

There is yet further provided in accordance with yet another preferred embodiment of the present invention a method for manufacture of an electronic interface assembly including providing a substrate having at least one substrate layer, associating an antenna with the at least one substrate layer and connecting opposite ends of the antenna to metal elements associated with the substrate.

Preferably, the method also includes defining a pair of apertures in a substrate layer such that opposite ends of the antenna terminate at the apertures and placing the metal elements in each of the apertures prior to the connecting. Additionally or alternatively, the method also includes laminating the substrate layer together with a top layer and a bottom layer. Additionally, the method also includes forming a recess in the top layer and the substrate layer, attaching ends of connection wires to the metal elements, attaching opposite ends of the connection wires to a chip module and sealing the chip module in the recess.

Preferably, the attaching ends of connection wires to the metal elements includes laser bonding. Additionally or alternatively, the attaching opposite ends of the connection wires to a chip module includes soldering.

Preferably, the method is automated.

There is also provided in accordance with still another preferred embodiment of the present invention an electronic interface assembly including a substrate having at least one layer, at least two terminals located in the at least one layer, a wire antenna associated with the substrate and having ends electrically coupled to the at least two terminals, a chip module mounted in a recess formed in the substrate, and wires providing electrical connections between the chip module and the wire antenna, the wires having a length substantially greater than the distance between their respective opposite ends in the electronic interface assembly.

Preferably, the chip module includes a packaged smart card chip. Additionally or alternatively, the wires are folded underneath the chip module in the recess.

BRIEF DESCRIPTION OF THE DRAWINGS

The present invention will be understood and appreciated more fully from the following detailed description, taken in conjunction with the drawings in which:

FIGS. 4A and 4B are, respectively, simplified pictorial and sectional illustrations of a yet further step in the manufacture of the electronic interface card of FIG. 1;

FIGS. 5A and 5B are, respectively, simplified pictorial and sectional illustrations of a still further step in the manufacture of the electronic interface card of FIG. 1;

FIGS. 7A and 7B are, respectively, simplified pictorial and sectional illustrations of a further additional step in the manufacture of the electronic interface card of FIG. 1;

FIGS. 8A and 8B are, respectively, simplified pictorial and sectional illustrations of a yet further additional step in the manufacture of the electronic interface card of FIG. 1;

FIGS. 9A and 9B are, respectively, simplified pictorial and sectional illustrations of a still further additional step in the manufacture of the electronic interface card of FIG. 1.

DETAILED DESCRIPTION OF A PREFERRED EMBODIMENT

Figure 1:
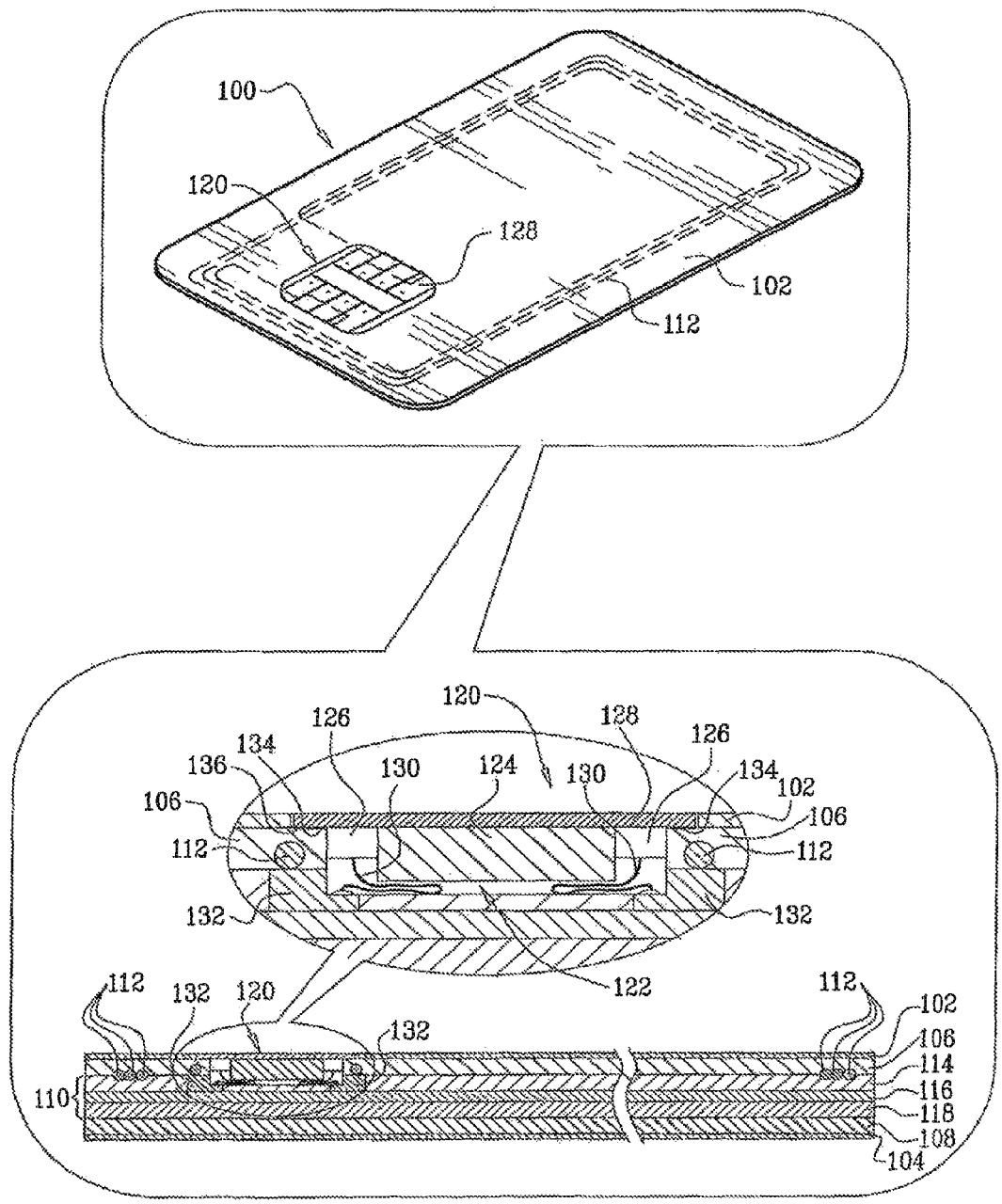
FIG. 1 is a simplified pictorial and sectional illustration of an electronic interface card having both contact and contactless functionalities, constructed and operative in accordance with a preferred embodiment of the present invention.

Reference is now made to FIG. 1, which illustrates an electronic interface card 100 having contact and/or contactless functionalities, constructed and operative in accordance with a preferred embodiment of the present invention. As seen in FIG. 1, electronic interface card 100 preferably comprises a multiple-layer substrate including top and bottom protection layers 102 and 104, typically formed of PVC (PolyVinyl Chloride), each typically of thickness 0.05 mm. Alternatively, protection layers 102 and 104 may be formed of any other suitable material, such as Teslin®, PET-G (PolyEthyleneTerephthalate-Glycol), PET-F (PolyEthylene-Terephthalate-Film), polycarbonate or ABS.

Disposed inwardly of both of protection layers 102 and 104 are preferably artwork layers 106 and 108, typically formed of PVC, each typically of thickness 0.15 mm, typically bearing artwork which is visible through respective protection layers 102 and 104. Alternatively, artwork layers 106 and 108 may be formed of any suitable material, such as Teslin®, PET-G (PolyEthyleneTerephthalate-Glycol), PET-F (PolyEthyleneTerephthalate-Film), polycarbonate or ABS. Alternatively, artwork layers 106 and 108 may be obviated.

Disposed inwardly of both of artwork layers 106 and 108 there is preferably provided an inlay 110 including a wire antenna 112, preferably of wire diameter 0.1 mm, embedded in a first inlay layer 114, typically formed of PVC, preferably of thickness 0.15 mm. Inlay 110 also includes second and third inlay layers 116 and 118, also preferably formed of PVC, of respective thicknesses 0.1 mm and 0.15 mm, respectively. Alternatively, first, second and third inlay layers 114, 116 and 118 may be formed of any other suitable material, such as Teslin®, PET-G (PolyEthyleneTerephthalate-Glycol), PET-F (PolyEthyleneTerephthalate-Film), polycarbonate or ABS.

A chip module 120 is mounted in a recess 122 formed in electronic interface card 100. The chip module preferably includes a packaged smart card chip 124 having pads 126 and an array 128 of contacts, preferably of thickness 0.06 mm. Alternatively, contacts 128 may be obviated and smart card chip 124 may provide contactless functionality.

Electrical connections between the chip module 120 and the embedded antenna 112 are provided by wires 130, preferably of thickness 0.1 mm, which are preferably soldered at first ends thereof to pads 126 and laser bonded at opposite ends thereof to metal elements 132 which are bonded to respective ends of wire antenna 112. It is a particular feature of the present invention that the length of wires 130 between pads 126 and respective metal elements 132 is substantially longer than the distance between pads 126 and metal elements 132 in the assembled card. This feature provides enhanced reliability.

A layer 134 of hot melt adhesive, disposed at the periphery of the underside of array 128 of contacts, retains the chip module 120 in recess 122, by engaging a corresponding recessed peripheral facing surface 136 of layer 106.

Figure 2:
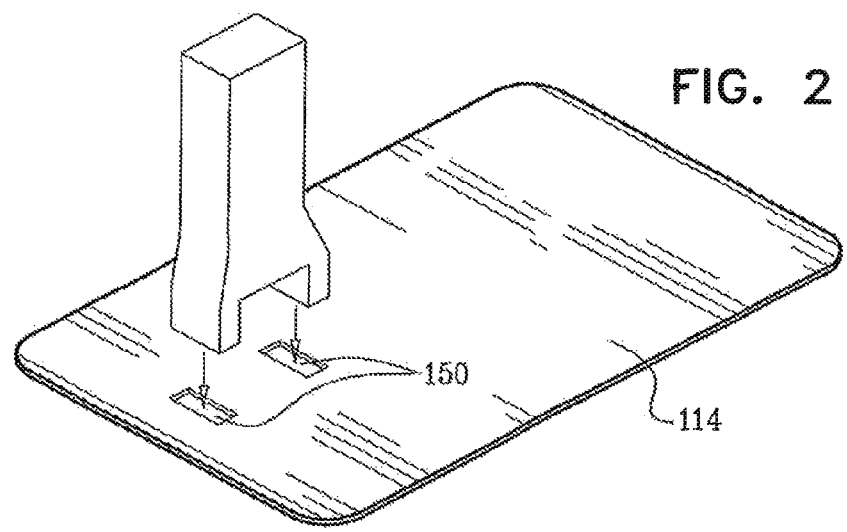
FIG. 2 is a simplified pictorial illustration of an initial step in the manufacture of the electronic interface card of FIG. 1.
Figure 3A:
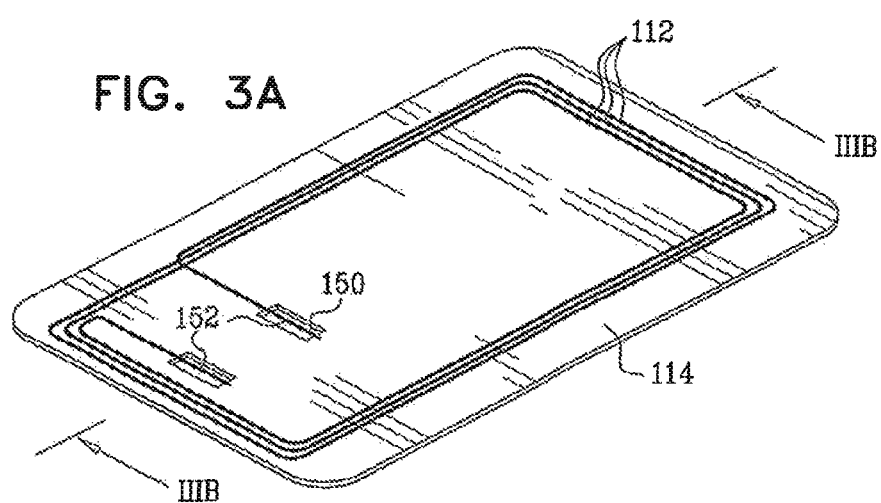
FIGS. 3A and 3B are, respectively, simplified pictorial and sectional illustrations of a further step in the manufacture of the electronic interface card of FIG. 1.
Figure 3B:
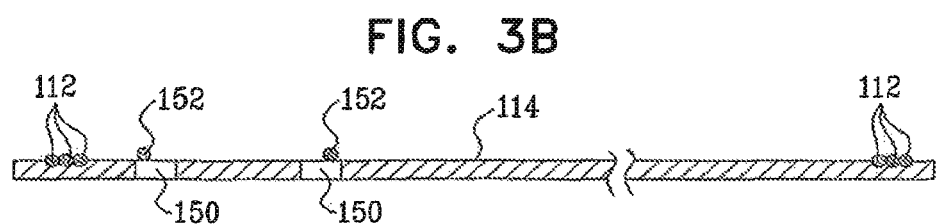

Reference is now made to FIG. 2, which is a simplified pictorial illustration of an initial step in the manufacture of the electronic interface card of FIG. 1 in which layer 114 is punched to define a pair of apertures 150. As see in FIGS. 3A and 3B, antenna 112 is associated with layer 114, as by known embedding techniques, typically employing an ultrasonic head commercially available from PCK Technology, Inc. of Islip, N.Y., U.S.A. Opposite ends 152 of antenna 112 terminate at apertures 150, as seen in FIGS. 3A and 3B.

Alternatively, antenna 112 may be a printed antenna formed on substrate 114 by suitable printing techniques or may be an antenna attached to substrate 114 by any suitable attachment method.

Turning now to FIGS. 4A and 4B, it seen that adhesive pads 154 are mounted onto layer 114 at corresponding edges 156 of apertures 150. As seen in FIGS. 5A and 5B, metal elements 132 are placed in apertures 150 and are retained in position therein by adhesive pads 154. Preferably the ends 152 of antenna 112 are connected to metal elements 132 by thermal-compression bonding or any other suitable technique. Following this connecting step, the adhesive pads 154 are no longer needed to retain the metal elements 132 in place and the pads 154 are removed. It is appreciated that alternatively adhesive pads 154 need not be removed.

Figure 6A:
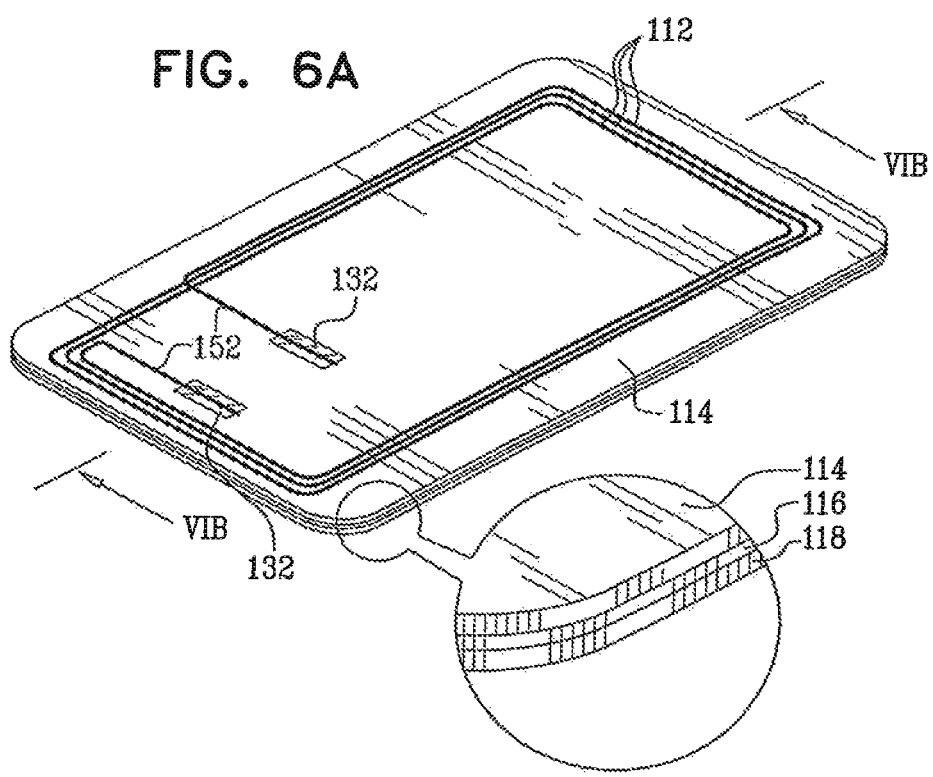
FIGS. 6A and 6B are, respectively, simplified pictorial and sectional illustrations of an additional step in the manufacture of the electronic interface card of FIG. 1.
Figure 6B:
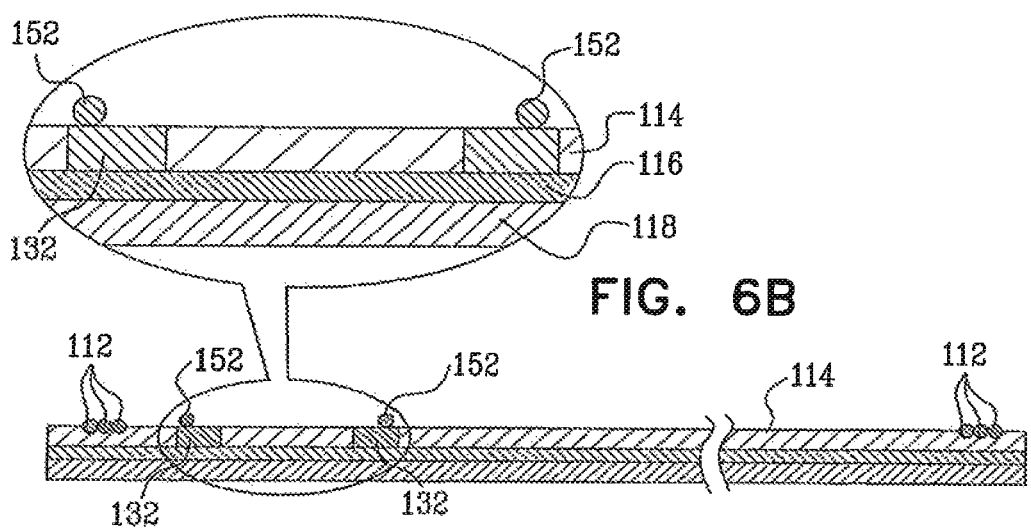

At this stage, as seen in FIGS. 6A and 6B, layers 116 and 118 are provided onto the underside of layer 114 and layers 102, 104, 106 and 108 are all laminated together therewith, with the resulting laminated structure appearing as shown in FIGS. 7A and 7B.

Turning now to FIGS. 8A and 8B, it is seen that recess 122 is formed in layers 102, 106 and 114 and metal elements 132 and recessed peripheral facing surface 136 of layer 106 is exposed, preferably by milling. It is appreciated that alternatively the recess may be formed on the opposite surface of the card. As seen in FIGS. 9A and 9B, thin wires 130 are attached, preferably by laser bonding, to metal elements 132. The wires 130 are trimmed and preferably arranged to extend generally perpendicularly to layer 102.

Figure 10A:
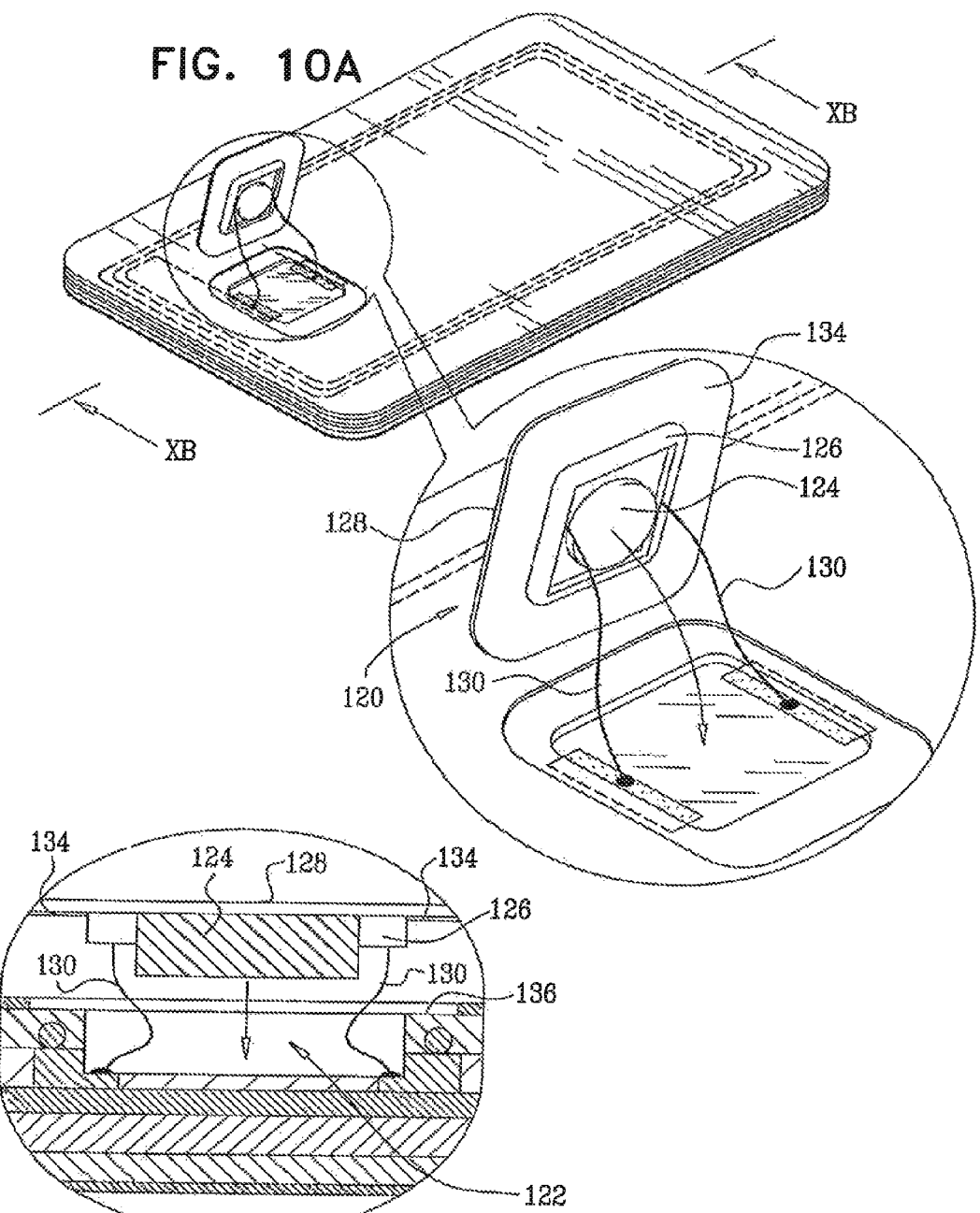
FIGS. 10A and 10B are, respectively, simplified pictorial and sectional illustrations of a final step in the manufacture of the electronic interface card of FIG. 1.
Figure 10B:
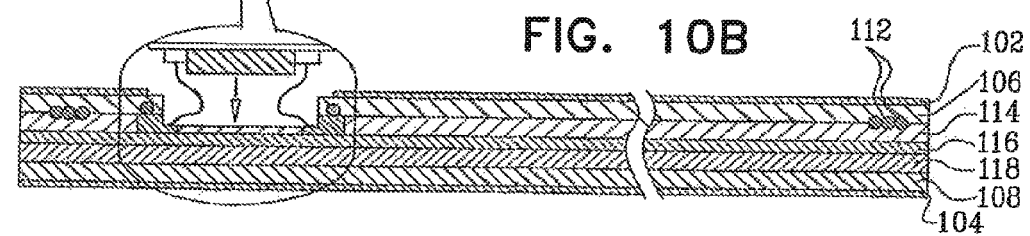

Turning now to FIGS. 10A and 10B, it is seen that following attachment of wires 130 to corresponding pads 126 of the chip module 120, and placement of hot melt adhesive 134 on the periphery of the underside of array 128, the chip module 120 is inserted into recess 122 such that the periphery of array 128 sealingly engages recessed peripheral facing surface 136 of layer 106. The insertion method is such that wires 130 are folded underneath the chip module 120, as seen in FIG. 1.

It is appreciated that the methodology described hereinabove with respect to FIGS. 1-10B is preferably highly automated.

It is appreciated that while the illustrated embodiment described herein includes substrate layers 102, 104, 106, 108, 114, 116 and 118, the multiple-layer substrate of electronic interface card 100 may include any suitable number of layers of any suitable thickness.

It is also appreciated that any or all of the layers of the multi-layer substrate of electronic interface card 100 may be formed of any of the materials described hereinabove, or any other suitable material, such as a composite material. Additionally, the layers of the multi-layer substrate of electronic interface card 100 need not be formed of the same material and each layer may be formed of a different material or different materials.

It will be appreciated by persons skilled in the art that the scope of the present invention is not limited by what has been particularly shown and described hereinabove. Rather, the invention includes both combinations and subcombinations of the various features described hereinabove as well modifications and variations thereof which would occur to persons skilled in the art upon reading the foregoing description together with the drawings and which are not in the prior art.

The invention claimed is:

1. A chip card with an electronic interface assembly, comprising:
   a substrate having a first inlay layer of an original thickness;
   at least two metal elements located in penetrations through said first inlay layer, the metal elements having the same thickness as the original thickness of the first inlay layer;
   a wire antenna embedded in a top surface of said first inlay layer and having ends, each end electrically coupled to a top surface of one of said at least two metal elements;
   a top layer laminated with said first inlay layer;
   a chip module mounted in a recess formed in said first inlay layer and said top layer exposing said metal elements, the chip module having at least two pads; and
   connection wires providing electrical connections between said chip module and said metal elements, wherein each of said connection wires is a single integral piece having a first end attached to one of said metal elements and an opposite end attached to one of the at least two pads of said chip module, and wherein a length of the connection wires from the at least two pads to the metal elements is longer than a distance from the at least two pads to the metal elements in the chip card such that each of said connection wires has sufficient length to extend outside of said recess after connection to said metal elements and said at least two pads.

2. A chip card according to claim 1 and wherein said chip module comprises a packaged smart card chip.

3. A chip card according to claim 1 and wherein said wires are folded underneath said chip module in said recess.

4. A chip card according to claim 1 and wherein said recess in said metal elements is formed by milling.

5. A chip card according to claim 1 and wherein said connection wires are connected to said metal elements by laser bonding.

\* \* \* \* \*